United States Patent [19]
Tran et al.

[11] Patent Number: 5,864,252
[45] Date of Patent: Jan. 26, 1999

[54] SYNCHRONOUS CIRCUIT WITH IMPROVED CLOCK TO DATA OUTPUT ACCESS TIME

[75] Inventors: Thinh Dinh Tran, Milpitas; Tsu-Wei Frank Lee, Monte Sereno, both of Calif.

[73] Assignee: Galvantech, Inc., Santa Clara, Calif.

[21] Appl. No.: 800,195

[22] Filed: Feb. 13, 1997

[51] Int. Cl.[6] .................................................. H03K 3/289
[52] U.S. Cl. ........................... 327/202; 327/203; 327/144
[58] Field of Search ..................................... 327/141, 144, 327/145, 201, 202, 203, 208–213, 218

[56] References Cited

U.S. PATENT DOCUMENTS

| | | | |
|---|---|---|---|
| 5,130,568 | 7/1992 | Miller et al. | 327/202 |
| 5,162,667 | 11/1992 | Yasui et al. | 327/203 |
| 5,259,006 | 11/1993 | Price et al. | 327/141 |

*Primary Examiner*—Tuan T. Lam

*Attorney, Agent, or Firm*—Blakely, Sokoloff, Taylor & Zafman LLP

[57] ABSTRACT

A synchronous circuit, such as an SRAM, a DRAM or a programmable logic device, has internal circuitry, a master input latch clocked by a master clock generator, and a slave output latch clocked by a slave clock generator. The master input latch is rendered transparent prior to the start of system setup time so that information input signals can pass through the master input latch and undergo processing in the circuitry prior to the start of a system cycle. After correct and stable information output signals are generated by the internal circuitry, these signals are latched into the slave output latch as correct and stable output information. The master latch may be clocked from the latched to the transparent state before the slave latch is clocked from the transparent to the latched state, provided that the time period between these two transitions is less than the minimum processing time of the internal circuitry. By advancing the start of the internal signal processing by a time period equal to the system setup time, the system clock to data output access time is substantially shortened.

18 Claims, 1 Drawing Sheet

SYNCHRONOUS CIRCUIT WITH IMPROVED CLOCK TO DATA OUTPUT ACCESS TIME

BACKGROUND OF THE INVENTION

This invention relates to synchronous circuits of the type found in many computer systems in general. More particularly, this invention relates to a synchronous circuit with improved clock to valid data output access time.

Synchronous circuits are widely used in computer systems due to the speed with which input information can be processed and made available as valid output information. Examples of such synchronous circuits are synchronous DRAMs, synchronous SRAMs and synchronous programmable logic devices. Such circuits are usually synchronized by a system clock provided by a separate system clock generator, which provides the system timing cycle for all synchronous circuits in a given system.

Current synchronous circuits typically employ one or more input registers to capture information on the input terminals, and zero or more output registers/latches in order to present the processed information emerging from the synchronous circuit to follow-on system circuitry. The registers are typically implemented as master and slave latches in which data presented to the input of the register is latched in on the rising edge of the system clock by sampling and storing input data to the master latch, and data latched in the master latch is transferred into the slave latch and latched therein on the falling edge of the system clock. When the master latch is unlatched by the system clock high to low transition, the master latch becomes transparent to any signals on the input lines thereto. Similarly, when the slave latch becomes unlatched due to a low to high transition of the system clock, the slave latch becomes transparent to any signals on the input lines thereto. The term "transparent" is understood to mean that signals appearing on the input lines pass through the latch and appear on the output lines (subject to the delay introduced by the response time of the individual circuit components making up a given latch). An example of a conventional synchronous SRAM circuit having a register consisting of a master-slave latch is shown and described in U.S. Pat. No. 5,493,530 issued Feb. 20, 1996, for "RAM with Pre-Input Register Logic", the disclosure of which is hereby incorporated by reference.

In order to guarantee the reliability of information latched into a synchronous circuit, a system designer normally specifies a parameter termed "setup time", which is a minimum time period during which the input lines must be stable (i.e., in a ready state) prior to the occurrence of a latching edge of a system clock signal. This is due to the fact that the latching edge of the system clock signal causes the various registers to sample and store the values of the connected input lines. Similarly, the system designer also normally specifies another parameter termed the "hold time" which is a minimum time period during which the input lines need to be stable immediately after the occurrence of the latching edge of the system clock signal. The time periods prior to the beginning of setup time and following the hold time are typically designated as "don't care" periods in which the state of the input lines does not affect the synchronous circuitry processing.

In the operation of a typical synchronous circuit, once the input information has been latched into the register consisting of the master-slave latch, the information output from this register is then processed by the internal or core logic circuitry to perform a desired function. For example, in a synchronous SRAM circuit, the information on the output lines from the master-slave input register is typically decoded and used to access individual memory cells for the purpose of either a read or a write operation. Taking a read operation as an example, once the individual memory cells have been properly accessed, the data contents of the cells are presented to the input lines of the output latch, output register or output buffer. At the beginning of the next system cycle, this data is latched into the output latch, output register or the input register of the follow-on circuitry, while new information is presented and latched into the input register for next system cycle processing.

In any synchronous circuit, there is a finite processing time after the presentation of the input information to the internal circuitry before valid information can be available at the output of the circuit. This processing time is termed the "delay time", and must be observed when designing synchronous circuits in order to insure that valid information will always be available for the next stage circuits or be latched into the circuit output register for presentation to the follow-on circuitry. The delay time is a function of the response time of the individual logic circuit components, as well as a function of component temperature, operating voltages, and inherent device speed.

An important parameter for synchronous circuits is the system clock to data output access time, which is the minimum time period between the latching edge of the system clock and the guaranteed appearance of correct and stable output information. In general, the smaller the system clock to data output access time, the more useful the synchronous circuit, due primarily to the increasingly high processing speeds of current computer systems. However, the system clock to data output access time in known synchronous circuits has been limited to a minimum value equal to the delay time of the internal circuits. Efforts to date to provide synchronous circuits with system clock to data access output times less than the delay time have been very limited.

SUMMARY OF THE INVENTION

The invention comprises a synchronous circuit and method of operation thereof which provides shorter system clock to data output access time than those heretofore deemed possible.

From an apparatus standpoint, the invention comprises a synchronous circuit having internal circuitry for processing input information signals and providing processed output information signals, an input latch clocked by an input clock generator for receiving the information input signals and presenting the information input signals to the internal circuitry, and an output latch clocked by an output clock signal for presenting correct and valid processed output signals from the internal circuitry to follow-on system circuitry. The input latch is clocked by the input clock generator between a latched state and a transparent state; while the output latch is clocked by the output clock generator between a latched state and a transparent state.

The input latch is clocked to the transparent state before the beginning of the system setup time, so that input information signals pass through the input latch and are subject to internal processing by the internal circuitry prior to the end of the system setup time (and preferably throughout the entire duration of the system setup time) so that internal signal processing begins before the start of a system cycle. As a consequence, correct and stable output processing information signals are made available to the output latch and to the circuit output earlier in the system cycle than in prior art synchronous circuits.

From a process standpoint, the invention comprises a method for reducing the system clock to data output access time in a synchronous circuit by allowing information input signals to propagate to the internal circuitry through an input latch rendered transparent during the system setup time, presenting the resulting processed output signals to a transparent output latch, and latching the processed output signals into the output latch when the processed output signals are deemed to be correct and stable. The input latch is clocked to the latched state at the beginning of the system cycle within the system hold time in order to maintain the information input signals correct and stable for a minimum period of time after the beginning of the system cycle required to complete the internal processing of the input information signals through the internal circuitry. The input latch is clocked from the latched to the transparent state prior to the beginning of the next system setup time. The output latch is clocked from the transparent to the latched state after the processed information signals from the internal circuitry are correct and stable. The output latch is clocked from the latched to the transparent state after the input latch has been clocked from the transparent state to the latched state. The output latch may be clocked from the transparent state to the latched state after the input latch has been clocked from the latched state to the transparent state, provided that the time period between these two transitions is less than the minimum delay time for input signals processed by the internal circuitry.

By taking advantage of the system setup time, advanced preprocessing of the information input signals by the internal circuitry can occur, which substantially shortens the system clock to data output access time required for correct and valid data to appear on the output terminals of the synchronous circuit.

For a fuller understanding of the nature and advantages of the invention, reference should be made to the ensuing detailed description, taken in conjunction with the accompanying drawings.

DETAILED DESCRIPTION OF THE PREFERRED EMBODIMENTS

Figure 1:
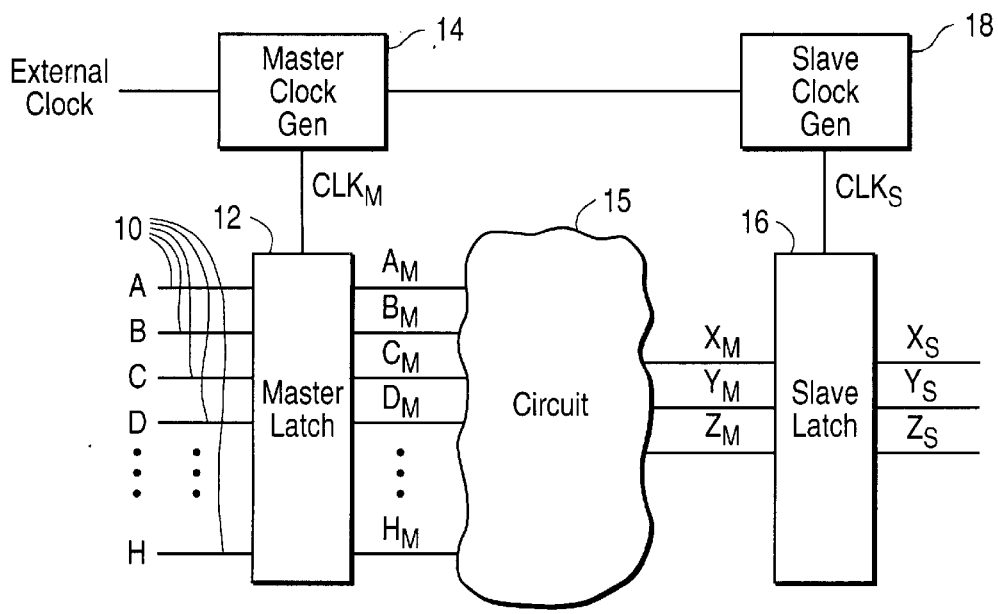
FIG. 1 is a schematic diagram illustrating the invention.

Turning now to the drawings, FIG. 1 is a schematic diagram illustrating a synchronous logic circuit according to the invention. As seen in this figure, system input information, such as address and data designated as signals A–H, are presented on individual input terminals 10 of a master input latch 12. The input information is latched into master input latch 12 by means of a master input clock signal termed "CLKM" generated by a master input clock generator 14. An external clock signal, which is the system clock, is provided as a reference clock input signal to master input clock generator 14. The information signals which pass through the master input latch 12, and which are designated AM–HM in FIG. 1, are presented to the internal circuitry 15 for internal processing. If the synchronous circuit comprises an SRAM, for example, internal circuitry 15 may comprise address decoding logic elements, the memory core elements, and the output buffer circuit elements normally found in synchronous circuits of this type. The processed signals emanating from internal circuitry 15, and which are designated XM–ZM herein, are presented to the input terminals of a slave output latch 16 whose state is controlled by a slave output clock generator 18. Slave output clock generator 18 is provided with a clock reference input from master clock generator 14 in order to control certain relationships therebetween. In the alternative, slave output clock generator 18 may receive as a reference the external clock signal, and master input clock generator 14 and slave output clock generator 18 may be designed to preserve the relationships discussed below using the external clock generator as a common reference signal. Slave output latch 16 presents the desired output signals on the output terminals thereof as signals designated XS–ZS.

Master input latch 12 and slave output latch 16 both have two different states: a latched state and an unlatched or transparent state. In the latched state, the individual information signals are stored therein and available on the output terminals thereof. In this latched state, any change on the input terminals is not reflected on the output terminals. In the unlatched or transparent state, signals present on the input terminals are passed through the latch to the output terminals thereof so that, as the input signals change values, these changes are immediately reflected on the output terminals.

Figure 2:
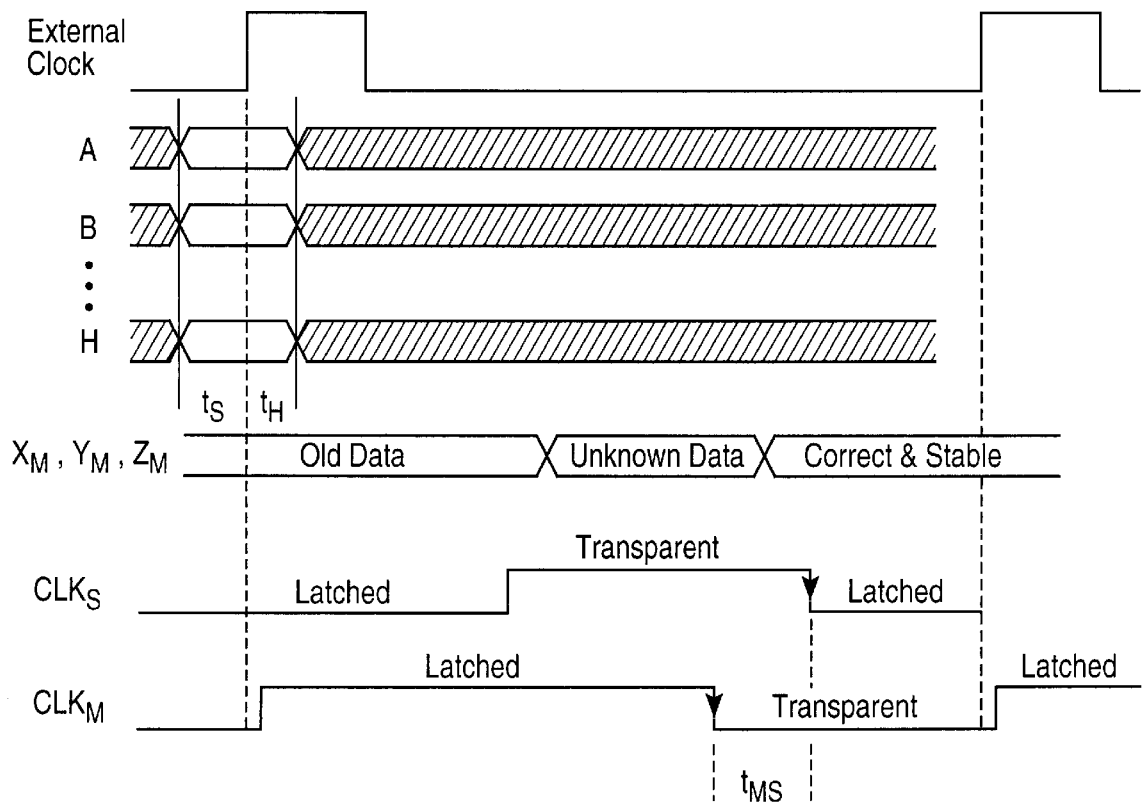
FIG. 2 is a timing diagram illustrating the operation of the embodiment of FIG. 1.

FIG. 2 is a timing diagram illustrating certain interrelationships among the external clock, the master input and slave output clocks, the system setup and hold times, and the latching of information into master input latch 12 and slave output latch 16. In this figure, the external clock is the uppermost trace. The following three traces illustrate the setup time and hold time for the input signals A–H. The next trace illustrates the status of the processed signals XM–ZM from internal circuitry 15. The last two traces are the slave output clock CLKS and the master input clock CLKM, respectively.

As can be seen in FIG. 2, the relationship of the setup time and the hold time is the known relationship described above and is defined with respect to the rising (latching) edge of the external clock, which defines the beginning of a system cycle. Thus, the setup time is seen to be a time period of predetermined duration prior to the latching edge of the external clock, while the hold time is a period of predetermined duration immediately after the latching edge of the external clock. The slave output clock and master input clock traces have been annotated in FIG. 2 to indicate the state of the associated latch. Thus, when the master input clock signal CLKM transitions from low to high, the master input latch 12 is latched; and when the master input clock signal CLKM transitions from high to low, the master input latch 12 is transparent. Conversely, when the slave output clock signal CLKS transitions from low to high, the slave output latch 16 is rendered transparent; while the high to low transition of the slave output clock signal CLKS places the slave output latch in the latched state.

In operation, when input information A–H is present on the input terminals of master input latch 12 at the beginning of the setup time, the master input latch is in the transparent state. As a consequence, input information signals A–H are free to propagate through master input latch 12 as input information signals AM–HM and into internal circuitry 15. Thus, prior to the beginning of a system cycle (defined by the rising edge of the external clock), internal circuitry 15 processes or begins processing the input information signals. This processing continues after master input latch 12 is latched in response to a rising edge of the master input clock signal. After the processing time delay inherent in internal circuitry 15, the processed information signals XM–ZM are presented to the input terminals of slave output latch 16 which will be in the transparent state. Consequently, signals XM–ZM pass through slave output latch 16 and are present on the output terminal thereof as output signals XS–ZS. However, since this occurs during a portion of the system cycle when the data is known to be unreliable, the follow-on circuitry does not use these signals at this time. After the unknown data period has elapsed, the slave output clock transitions from high to low, thereby latching the processed information signals XM–ZM into slave output latch 16. Thereafter, these signals are presented on the output terminals of slave output latch 16 as correct and stable output signals XS–ZS. Sometime prior to the beginning of the next setup time, the master input clock transitions high to low to render master input latch 12 again transparent. Further cycles continue in like manner.

For proper operation of the synchronous circuit, certain state relationships must be observed with respect to the master input latch 12 and the slave output latch 16. As already noted, master input latch 12 should preferably be in the transparent state prior to the beginning of the setup time for the next system cycle. The master input latch 12 must be clocked to the latched state no earlier than the beginning of the system hold time and no later than just before the end of the system hold time. Once the master input latch 12 is clocked to the latched state, the slave output latch 16 may be clocked from the latched state to the transparent state at any time during a period no longer than the largest processing delay introduced by internal circuitry 15. Slave output latch 16 may be clocked from the transparent state to the latched state at any time after the processed output signals XM–ZM are correct and stable. These signals will be correct and stable from a time period after latching of the master input latch 12 equal to the maximum processing delay provided by internal circuitry 15 to a time after master input latch 12 has been clocked to the transparent state plus the minimum processing delay introduced by internal circuitry 15.

It is noted that the master input latch 12 need not remain in the latched state until the processed information signals XM–ZM are latched into the input terminals of slave output latch 16. In fact, master input latch 12 can be clocked from the latched state to the transparent state prior to this time, in order to permit preprocessing of new information input signals A–H. It is only necessary that the time tms between the beginning of the transparent state of master input latch 12 and the beginning of the latched state of slave output latch 16 be less than the shortest processing delay provided by internal circuitry 15. This insures that processed output signals XM–ZM will not change in response to different input information signals AM–HM before the current XM–ZM signals are latched into slave output latch 16.

While the preferred embodiment of the invention has been described with reference to a master input latch 12 and a slave output latch 16, it is understood that identical latches may be used at the input and output sides of the synchronous circuit provided that the latch clock generators are modified accordingly. For example, if the slave output latch 16 is replaced with a latch which functions in a manner identical to master input latch 12, the corresponding clock generator 18 will generate a clock signal train which is the inverse of that shown as CLKS for slave output latch 16.

It should also be noted that, while slave output latch 16 has been described as positioned at the extreme output stage of the synchronous circuit, this latch may be moved upstream, if desired.

As will be apparent to those skilled in the art, the use of a master input latch 12 at the input side of the synchronous circuit, a slave output latch 16 at the output side of the circuit, and individual master input and slave output clocks enables the synchronous circuit to present correct and stable data at the output thereof in a shorter system clock to data output access time than known devices. This is principally due to the fact that processing of the input information signals A–H can take place throughout the setup time (since master input latch 12 is in the transparent state), which effectively provides a head start to the processing operation equal to the value of the setup time period. This advanced processing capability can substantially reduce the system clock to data output access time. For example, for synchronous circuits in which the processing time is typically 7.5 nanoseconds, the setup time can be as much as 2 nanoseconds.

While the above provides a full and complete disclosure of the preferred embodiments of the invention, various modifications, alternate constructions and equivalents may be employed, as desired. For example, while the invention has been described with reference to synchronous DRAMs, synchronous SRAMs and synchronous programmable logic devices, it is understood that other applications of the invention to different types of synchronous circuits are fully envisioned. Therefore, the above description and illustrations should not be construed as limiting the scope of the invention, which is defined by the appended claims.

What is claimed is:

1. A synchronous circuit for use with a system clock defining a system cycle and providing improved system clock to data output access time processing, said synchronous circuit comprising:

internal circuitry for processing information input signals and providing processed information output signals;

an input latch having a plurality of input terminals for receiving externally supplied information signals, and a plurality of output terminals coupled to said internal circuitry, said input latch having a latched state and a transparent state;

an input clock generator for clocking said input latch between the latched state and the transparent state;

an output latch having a plurality of input terminals coupled to said internal circuitry for receiving said processed information output signals therefrom, and a plurality of output terminals for outputting said processed output information signals, said output latch having a latched state and a transparent state;

an output clock generator for clocking said output latch between the latched state and the transparent state;

said input clock generator being capable of clocking said input latch to the transparent state prior to the beginning of a system setup time period to permit said externally supplied information signals present on the input terminals of said input latch to propagate therethrough and into said internal circuitry prior to the start of said system cycle, said output clock generator being capable of clocking said output latch to the latched state when the processed information output signals are correct and stable.

2. The synchronous circuit of claim 1 wherein said input clock generator generates an input clock signal to clock the input latch between said latched state, beginning no earlier than the start of said system cycle but no later than the end of a system hold time period, and said transparent state, beginning within the same system cycle but before the beginning of a system setup time for a subsequent system cycle.

3. The synchronous circuit of claim 1 wherein said input clock generator and said output clock generator are synchronized so that said output clock generator clocks said output latch to the latched state at a time after the processed information output signals become correct and stable but before the processed information output signals change state as a result of said input clock generator clocking the input latch to the transparent state.

4. The synchronous circuit of claim 1 wherein said input clock generator and said output clock generator are synchronized so that said output clock generator clocks said output latch to the transparent state at a time after said input latch is clocked to the latched state but before the processed information output signals are correct and valid.

5. The synchronous circuit of claim 1 wherein said internal circuitry includes logic circuits.

6. The synchronous circuit of claim 1 wherein said internal circuitry includes a memory array.

7. A method of processing signals in a synchronous circuit for improved system clock to data output access time, said method comprising the steps of:
  receiving the system clock having a system cycle;
  determining a system setup time prior to a first transition of said system clock and a system hold time subsequent to the first transition of the system clock;
  generating an input clock signal and an output clock signal in response to the system clock;
  using the input clock signal to clock an input latch to a transparent state prior to the system setup time to provide information input signals to internal circuitry for processing;
  outputting processed information output signals from said internal circuitry; and
  using the output clock signal to clock an output latch into a latched state and to latch said processed information output signals during the system cycle.

8. The method of claim 7 further comprising the step of using the input clock signal to clock the input latch to a latched state during the system hold time.

9. The method of claim 7 further comprising the step of using the output clock signal to clock the output latch into a transparent state prior to being clocked into the latched state, wherein the output latch outputs the processed information output signals from the internal circuitry when the output latch is in the transparent state.

10. A synchronous circuit for use with a system clock having a system cycle having a beginning and an end, comprising:
  an internal circuit having a plurality of inputs and a plurality of outputs, the plurality of inputs for receiving a plurality of information input signals, the plurality of outputs for providing a plurality of information output signals;
  an input latch having a plurality of inputs and a plurality of outputs, the plurality of inputs for receiving a plurality of externally applied information input signals, and the plurality of outputs coupled to the plurality of inputs of the internal circuit, the input latch providing the plurality of externally applied information input signals from its plurality of inputs to the plurality of inputs of the internal circuit prior to the beginning of the system cycle of the system clock when the system clock signal is in a first logic state, and the input latch latching the plurality of externally applied information input signals in response to the system clock transitioning to a second logic state; and
  an output latch having a plurality of inputs for receiving the plurality of information output signals from the plurality of outputs of the internal circuit, the output latch latching the plurality of information output signals from the internal circuit and outputting the plurality of information output signals prior to the end of the system clock cycle.

11. The synchronous circuit of claim 10, wherein the output latch is configured to output the plurality of information output signals prior to latching the plurality of information output signals.

12. The synchronous circuit of claim 10, further comprising:
  an input clock generator having an input for receiving the system clock, and an output for providing a first internal clock signal to the input latch; and
  an output clock generator having an input for receiving the system clock, and an output for providing a second internal clock signal to the output latch.

13. A synchronous circuit comprising:
  a clock input for receiving a system clock having a system cycle, wherein the synchronous circuit has a system setup time prior to a transition of the system clock, and a hold time after the transition of the system clock;
  an internal circuit configured to generate information output signals in response to information input signals;
  an input latch coupled to the internal circuit and the clock input, the input latch configured to operate in a transparent state prior to the system setup time and to provide the information input signals to the internal circuit, the input latch further configured to operate in a latched state in response to the transition of the system clock; and
  an output latch coupled to the internal circuit, wherein the output latch is configured to operate in a transparent state and output the information output signals from the internal circuit after the input latch is configured to operate in the latched state, and wherein the output latch is configured to operate in a latched state and latch the information output signals before a next transition of a subsequent cycle of the system clock.

14. The synchronous circuit of claim 13, further comprising:
  an input clock generator coupled to the clock input and providing a first internal clock signal to the input latch; and
  an output clock generator coupled to the clock input and providing a second internal clock signal to the output latch.

15. The synchronous circuit of claim 14, wherein the first internal clock signal configures the input latch to operate in the transparent and latched states, and wherein the second internal clock signal configures the output latch to operate in the transparent and latched states.

16. A method of processing signals in a synchronous circuit comprising the steps of:
  receiving a system clock signal having a system cycle determining a system setup time prior to a first transition of said system clock signal and a system hold time subsequent to the first transition of the system clock signal;
  passing information input signals through an input latch configured as a transparent latch to internal circuitry prior to the system setup time;

latching the information input signals into the input latch after the system setup time;

outputting information output signals from the internal circuit in response to the information input signals; and providing the information output signals to an output latch.

17. The method of claim 16, further comprising the step of configuring the output latch into a transparent state during the system cycle, wherein the information output signals pass through the output latch during the system cycle.

18. The method of claim 17, further comprising the step of configuring the output latch into a latched state during the system cycle, wherein the information output signals are latched by the output latch during the latched state and during the system cycle.

* * * * *

UNITED STATES PATENT AND TRADEMARK OFFICE
CERTIFICATE OF CORRECTION

PATENT NO.   : 5,864,252
DATED        : January 26, 1999
INVENTOR(S)  : Thinh Dinh Tran and Tsu-Wei Frank Lee It is certified that error appears in the above-identified patent and that said Letters Patent is hereby corrected as shown below:

At claim 16, line 3, insert --;-- after the "cycle".

Signed and Sealed this

Eighth Day of June, 1999

Q. TODD DICKINSON

Attest:

Attesting Officer

Acting Commissioner of Patents and Trademarks